United States Patent
Xu

(10) Patent No.: US 10,319,325 B2
(45) Date of Patent: Jun. 11, 2019

(54) SHIFT REGISTER UNIT, DRIVING METHOD THEREOF, GATE DRIVING CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Fei Xu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/718,100

(22) Filed: Sep. 28, 2017

(65) Prior Publication Data
US 2018/0240431 A1  Aug. 23, 2018

(30) Foreign Application Priority Data
Feb. 23, 2017 (CN) .......................... 2017 1 0101683

(51) Int. Cl.
G09G 3/36 (2006.01)
G11C 19/28 (2006.01)

(52) U.S. Cl.
CPC ......... *G09G 3/3677* (2013.01); *G09G 3/3655* (2013.01); *G11C 19/28* (2013.01);
(Continued)

(58) Field of Classification Search
None
See application file for complete search history.

(56) References Cited

U.S. PATENT DOCUMENTS 7,561,656 B2   7/2009  Chang et al.
2014/0192039 A1*  7/2014  Wang ...................... G11C 19/28
                                                345/213
(Continued)

FOREIGN PATENT DOCUMENTS

CN  104485086 A  4/2015
CN  105513525 A  4/2016

OTHER PUBLICATIONS

First Office Action for Chinese Patent Application No. 2017101016833 dated Mar. 28, 2019.

*Primary Examiner* — Benjamin C Lee
*Assistant Examiner* — Krishna P Neupane
(74) *Attorney, Agent, or Firm* — Calfee, Halter & Griswold LLP

(57) ABSTRACT

The embodiments of the present disclosure provides a shift register unit, a driving method thereof, a gate driving circuit and a display device, which relate to the field of display technology. The shift register unit includes a pull-up control module, a reset module, a pull-up module, a pull-down control module and a pull-down module, wherein the pull-down control module is configured to pull a voltage level of the pull-down node down to the second voltage terminal under control of the pull-up node, or the pull-down control module is configured to store a voltage of the third voltage terminal and output a voltage of the third voltage terminal to the pull-down node or release the stored voltage to the pull-down node under control of the third voltage terminal and the second voltage terminal.

17 Claims, 6 Drawing Sheets

(52) U.S. Cl.
CPC ............... *G09G 2300/0408* (2013.01); *G09G 2310/0286* (2013.01); *G09G 2310/0289* (2013.01); *G09G 2310/08* (2013.01)

(56) References Cited

U.S. PATENT DOCUMENTS

2016/0055814 A1*  2/2016  Yang .................... G09G 3/3677
    345/213
2016/0172054 A1*  6/2016  Shag .................... G11C 19/184
    345/100

\* cited by examiner

SHIFT REGISTER UNIT, DRIVING METHOD THEREOF, GATE DRIVING CIRCUIT, AND DISPLAY DEVICE

CROSS-REFERENCES TO RELATED APPLICATIONS

This application claims priority to Chinese Patent Application No. 201710101683.3 filed in China on Feb. 23, 2017, the entire contents of which are hereby incorporated by reference.

TECHNICAL FIELD

The present disclosure relates to the field of display technology, and more particularly, to a shift register unit, a driving method thereof, a gate driving circuit and a display device.

BACKGROUND

A display, such as a TFT-LCD (Thin Film Transistor Liquid Crystal Display), is provided with an array substrate. The array substrate may be divided into a display region and a wiring region located at periphery of the display region. A gate driver for scanning gate lines line by line is provided in the peripheral region. An existing gate driver usually employs a GOA (Gate Driver on Array) design, to integrate a TFT (Thin Film Transistor) gate switching circuit into the peripheral region to constitute a GOA circuit, so as to achieve a narrow frame design.

The GOA circuit includes a plurality of shift register units, each of which corresponds to a gate line. During an output period of the shift register unit, the shift register unit may output a gate scan signal to the gate line corresponding thereto. For example, when the gate scan signal is at a high level, the shift register unit needs to be pulled down to a low level in a non-output period, to ensure that the gate line may be scanned line by line. In the prior art, in order to cause the shift register unit to output a low level in the above-described non-output period, a part of the transistors will be kept on all the time during the non-output period, such that a high level will be output to a pull-down node though the above transistor, and a signal output by the shift register unit may be lowered through the pull-down node.

However, as a size of the display increases continuously, the number of gate lines increases therewith, and thus the time of one image frame increases accordingly. Therefore, during the progressive scanning process, each of the gate lines will be mainly in the above non-scanning period in one image frame.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a shift register unit, a driving method thereof, a gate driving circuit and a display device.

In order to achieve the above objects, the embodiments of the present disclosure employ following technical solutions.

The embodiments of the present disclosure provide a shift register unit, including a pull-up control module, a reset module, a pull-up module, a pull-down control module and a pull-down module, wherein the pull-up control module is connected to a first voltage terminal, a signal input terminal and a pull-up node, and the pull-up control module is configured to output a voltage of the first voltage terminal to the pull-up node under control of the signal input terminal; the reset module is connected to a reset signal terminal, a second voltage terminal, and the pull-up node, and the reset module is configured to pull a voltage level of the pull-up node down to a voltage of the second voltage terminal under control of the reset signal; the pull-up module is connected to the pull-up node, a clock signal terminal and a signal output terminal, and the pull-up module is configured to output a signal of the clock signal terminal to the signal output terminal under control of the pull-up node; the pull-down control module is connected to the second voltage terminal, a third voltage terminal, the pull-up node and a pull-down node, and the pull-down control module is configured to pull a voltage level of the pull-down node down to the voltage of the second voltage terminal under control of the pull-up node, or the pull-down control module is configured to store a voltage of the third voltage terminal and output a voltage of the third voltage terminal to the pull-down node or release the stored voltage to the pull-down node under control of the third voltage terminal and the second voltage terminal; and the pull-down module is connected to the pull-down node, the pull-up node, the signal output terminal and the second voltage terminal, and the pull-down module is configured to pull the voltage level of the pull-up node and a voltage level of the signal output terminal down to the voltage of the second voltage terminal under control of the pull-down node.

The embodiments of the present disclosure provide a gate driving circuit, including any one of a plurality of cascaded shift register units described above, wherein a signal input terminal of a first stage shift register unit is connected to a start signal terminal; except for the first stage shift register unit, a signal output terminal of a previous stage shift register unit is connected to a signal input terminal of a next stage shift register unit; except for a last stage shift register unit, a signal output terminal of the next stage shift register unit is connected to a reset signal terminal of the previous stage shift register unit; and a reset signal terminal of the last stage shift register unit is connected to the start signal terminal.

The embodiments of the present disclosure provide a display device including the gate driving circuit described above.

The embodiments of the present disclosure provide a driving method for driving any one of the shift register units described above, wherein, within one image frame, the driving method includes: in a first period, the pull-up control module outputting the voltage of the first voltage terminal to the pull-up node under the control of the signal input terminal to charge the pull-up node; in a second period, the pull-up module outputting the signal of the clock signal terminal as a gate scan signal to the signal output terminal under the control of the pull-up node; in a third period, the reset module pulling the voltage level of the pull-up node down to the voltage of the second voltage terminal under the control of the reset signal terminal; the pull-down control module storing the voltage of the third voltage terminal and outputting the voltage of the third voltage terminal to the pull-down node or releasing the stored voltage to the pull-down node under the control of the third voltage terminal and the second voltage terminal; the pull-down module pulling the voltage level of the pull-up node and the voltage level of the signal output terminal down to the voltage of the second voltage terminal under the control of the pull-down node; and the pull-down control module repeating the third period until a next image frame.

It is to be understood that both the foregoing general description and the following detailed description are exemplary and explanatory only and are not restrictive of the present disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions of embodiments of the present disclosure, the drawings that need to be used to describe the embodiments and the prior art will be briefly described below. It will be apparent that the drawings in the following description are merely some embodiments of the present disclosure. Other drawings may be obtained by those skilled in the art based on these drawings without paying for creative labor.

REFERENCE NUMERALS

10: pull-up control module; 20: reset module; 30: pull-up module; 40: pull-down control module; 50: pull-down module; 60: reconfiguring module.

DETAILED DESCRIPTION

Hereinafter, the technical solutions of embodiments of the present disclosure will be described clearly and completely with reference to the accompanying drawings of embodiments of the present disclosure. Obviously, the described embodiments are merely part of the present disclosure, and not all embodiments. All other embodiments obtained based on embodiments in the present disclosure by those of ordinary skill in the art without making creative work are within the protection scope of the present disclosure.

Figure 1:
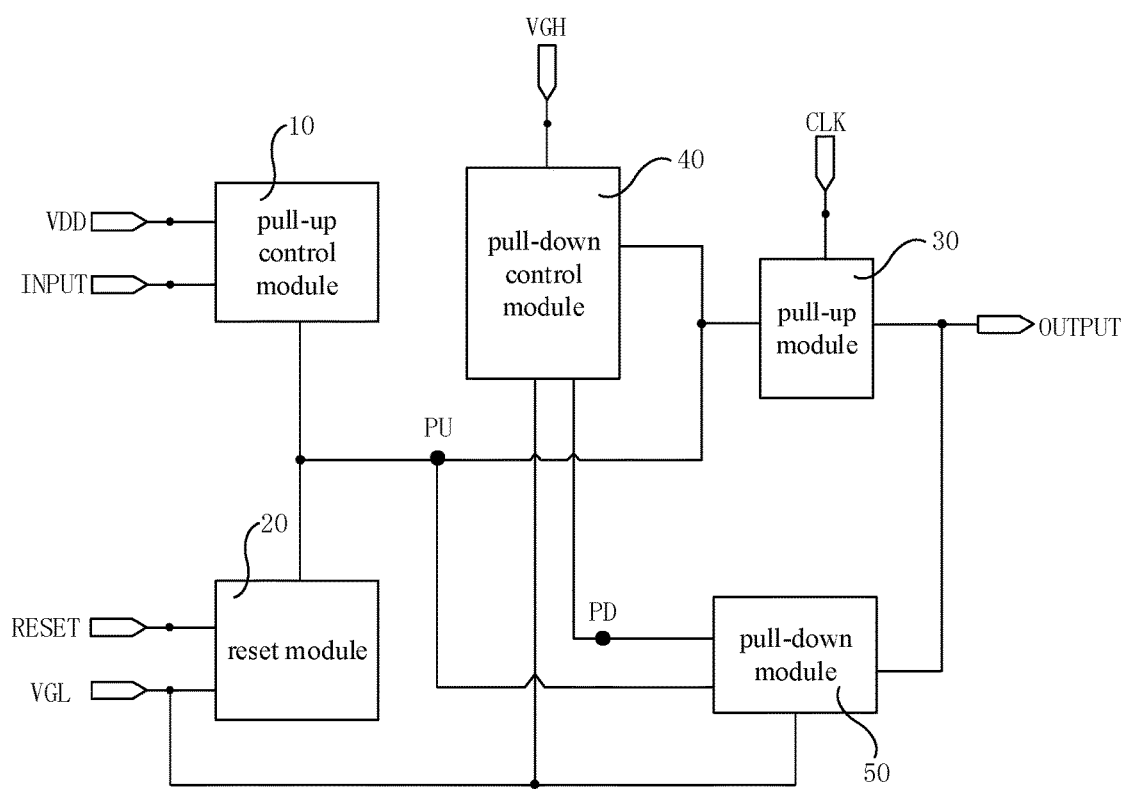
FIG. 1 is a schematic structural view of a shift register unit provided by an embodiment of the present disclosure.

The embodiments of the present disclosure provide a shift register unit, including a pull-up control module 10, a reset module 20, a pull-up module 30, a pull-down control module 40, and a pull-down module 50, as shown in FIG. 1.

In the embodiment, the pull-up control module 10 is connected to a first voltage terminal VDD, a signal input terminal INPUT and a pull-up node PU. The pull-up control module 10 is configured to output a voltage of the first voltage terminal VDD to the pull-up node PU under control of the signal input terminal INPUT.

The reset module 20 is connected to a reset signal terminal RESET, a second voltage terminal VGL, and the pull-up node PU. The reset module 20 is configured to pull a voltage level of the pull-up node PU down to the second voltage terminal VGL (i.e., down to the voltage of the second voltage terminal VGL) under control of the reset signal RESET.

The pull-up module 30 is connected to the pull-up node PU, a clock signal terminal CLK and a signal output terminal OUTPUT. The pull-up module 30 is configured to output a signal of the clock signal terminal CLK to the signal output terminal OUTPUT under control of the pull-up node PU.

The pull-down control module 40 is connected to the second voltage terminal VGL, a third voltage terminal VGH, the pull-up node PU and a pull-down node PD. The pull-down control module 40 is configured to pull a voltage level of the pull-down node PD down to the second voltage terminal VGL under control of the pull-up node PU.

Optionally, the pull-down control module 40 is configured to store a voltage of the third voltage terminal VGH and output a voltage of the third voltage terminal VGH to the pull-down node PD or release the stored voltage to the pull-down node PD under control of the third voltage terminal VGH and the second voltage terminal VGL.

The pull-down module 50 is connected to the pull-down node PD, the pull-up node PU, the signal output terminal OUTPUT and the second voltage terminal VGL. The pull-down module 50 is configured to pull the voltage level of the pull-up node PU and a voltage level of the signal output terminal OUTPUT down to the second voltage terminal VGL under control of the pull-down node PD.

In this way, in the output period of the shift register unit, the pull-up module 30 may output the signal of the clock signal CLK as a gate scan signal to a gate line connected to the signal output terminal OUTPUT under the control of the pull-up node PU. While in the non-output period of the shift register unit, a voltage level of the signal output terminal OUTPUT needs to be pulled down to a voltage of the second voltage terminal VGL through the pull-down module 50 under the control of the pull-down node PD. In order to make the pull-down node PD have the above function, in the non-output period, the pull-down control module 40 may output the voltage of the third voltage terminal VGH to the pull-down node PD or the pull-down control module 40 may release the stored voltage to the pull-down node PD, to ensure a voltage level of the pull-down node. Thus, the transistor in the pull-down control module 40 for outputting the voltage of the third voltage terminal VGH to the pull-down node PD does not need to remain in an operating state throughout the non-output period, so that the service life of the above transistor may be prolonged.

Figure 2:
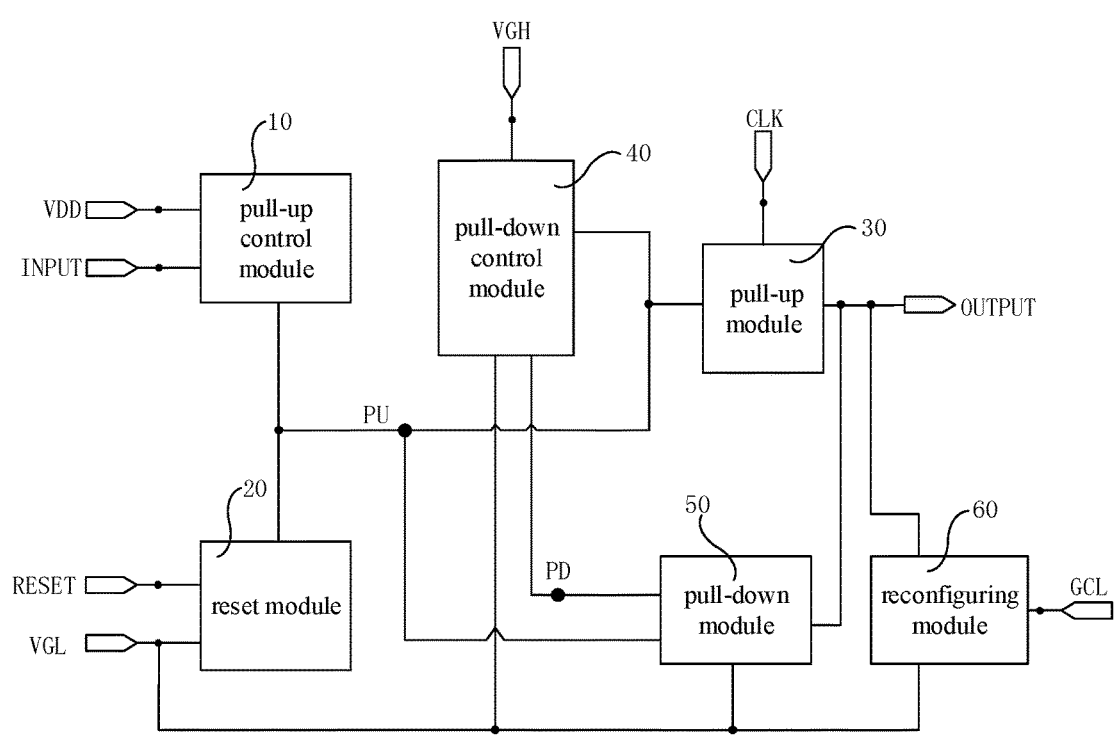
FIG. 2 is another schematic structural view of a shift register unit provided by an embodiment of the present disclosure.

On the basis of this, in order to prevent the voltage of the previous image frame remaining on the signal output terminal OUTPUT from affecting the signal output from the signal output terminal OUTPUT of the current image frame, in one image frame, before the signal output terminal OUTPUT outputs the gate scan signal, it is necessary to clear the voltage remaining on the signal output terminal OUTPUT. In order to achieve the above object, it is preferable that the shift register unit further includes a reconfiguring module 60, as shown in FIG. 2.

In the embodiment, the reconfiguring module 60 is connected to a fourth voltage terminal GCL, the second voltage terminal VGL and the signal output terminal OUTPUT. In this case, in one image frame, before the signal output terminal OUTPUT outputs a gate scan signal, the reconfiguring module 60 may pull down the voltage level of the signal output terminal OUTPUT to the second voltage terminal VGL under the control of the fourth voltage terminal GCL.

The specific structure of each module in FIG. 1 or 2 will be described in detail below.

Figure 3:
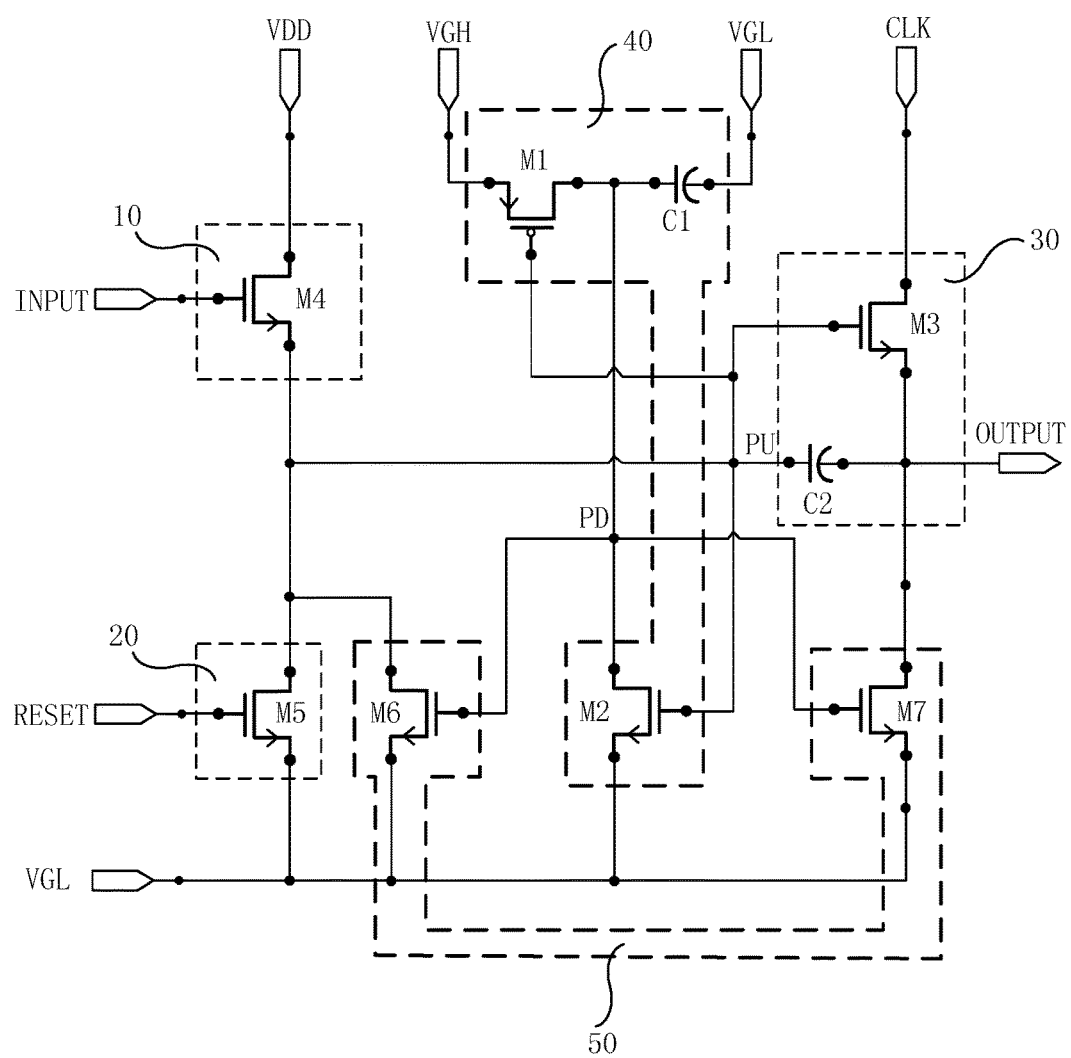
FIG. 3 is a schematic diagram of a specific structure of each module in FIG. 1.

Specifically, as shown in FIG. 3, the pull-down control unit 40 includes a first transistor M1, a second transistor M2 and a first capacitor C1.

In the embodiment, a gate electrode of the first transistor M1 is connected to the pull-up node PU, a first electrode of the first transistor M1 is connected to the third voltage terminal VGH, and a second electrode of the first transistor M1 is connected to one end of the first capacitor C1. The other end of the first capacitor C1 is connected to the second voltage terminal VGL.

In addition, a gate electrode of the second transistor M2 is connected to the pull-up node PU, a first electrode of the second transistor M2 is connected to the pull-down node PD, and a second electrode of the second transistor M2 is connected to the second voltage terminal VGL.

In the embodiment, the first transistor M1 is a P-type transistor and the second transistor M2 is an N-type transistor; or the first transistor M1 is an N-type transistor and the second transistor M2 is a P-type transistor.

The pull-up module 30 includes a third transistor M3 and a second capacitor C2. In the embodiment, a gate electrode of the third transistor M3 is connected to the pull-up node PU, the first electrode of the third transistor M3 is connected to the clock signal terminal CLK and the second electrode of the third transistor M3 is connected to the signal output terminal OUTPUT.

One end of the second capacitor C2 is connected to the gate electrode of the third transistor M3 and the other end of the second capacitor is connected to a second electrode of the third transistor M3.

The above pull-up control module 10 includes a fourth transistor M4, a gate electrode of the fourth transistor M4 is connected to the signal input terminal INPUT, a first electrode of the fourth transistor M4 is connected to the first voltage terminal VDD and a second electrode of the fourth transistor M4 is connected to the pull-up node PU.

The reset module 20 includes a fifth transistor M5, a gate electrode of the fifth transistor M5 is connected to the reset signal terminal RESET, a first electrode of the fifth transistor M5 is connected to the pull-up node PU and a second electrode of the fifth transistor M5 is connected to the second voltage terminal VGL.

In addition, the pull-down module 50 includes a sixth transistor M6 and a seventh transistor M7. In the embodiment, a gate electrode of the sixth transistor M6 is connected to the pull-down node PD, a first electrode of the sixth transistor M6 is connected to the pull-up node PU and a second electrode of the sixth transistor M6 is connected to the second voltage terminal VGL.

A gate electrode of the seventh transistor M7 is connected to the pull-down node PD, a first electrode of the seventh transistor M7 is connected to the signal output terminal OUTPUT, and a second electrode of the seventh transistor M7 is connected to the second voltage terminal VGL.

Figure 4:
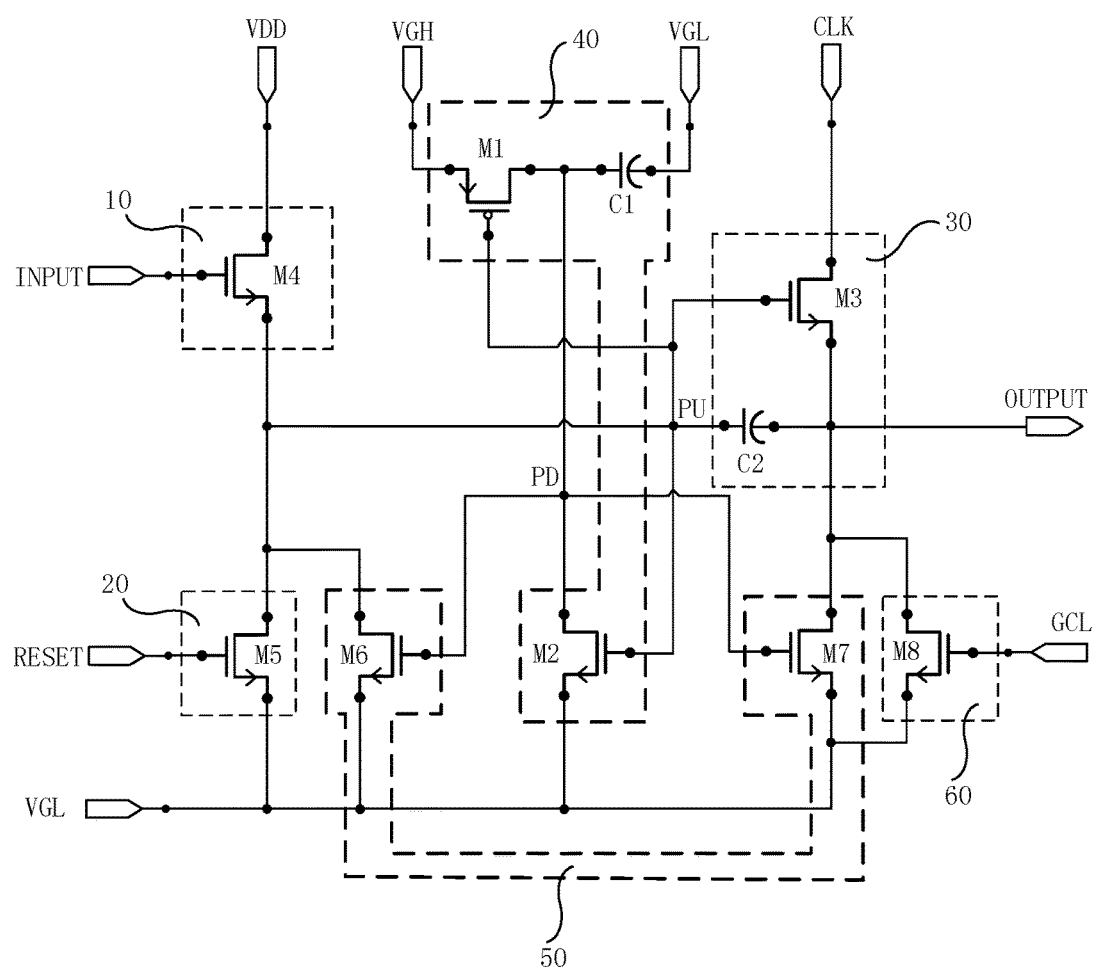
FIG. 4 is a schematic diagram of a specific structure of each module in FIG. 2.

On the basis of this, when the shift register unit further includes a reconfiguring module 60, as shown in FIG. 4, the reconfiguring module includes an eighth transistor M8. In the embodiment, a gate electrode of the eighth transistor M8 is connected to the fourth voltage terminal GCL, a first electrode of the eighth transistor M8 is connected to the signal output terminal OUTPUT and a second electrode of the eighth transistor M8 is connected to the second voltage terminal VGL.

It should be noted that, when the first transistor M1 is a P-type transistor, the other transistors are N-type transistors; optionally, when the first transistor M1 is an N-type transistor, the other transistors are P-type transistors.

In addition, a first electrode of any of the above-mentioned transistors is a source electrode, a second electrode is a drain electrode; optionally, the first electrode is the drain electrode and the second electrode is the source electrode.

The driving process of the shift register unit shown in FIG. 4 in one image frame will be described in detail with reference to FIG. 5.

In the embodiment, for ease of illustration, for example, the first transistor M1 is a P-type transistor, the other transistors are N-type transistors, both the first voltage terminal VDD and the third voltage terminal VGH output a constant high level, and the second voltage terminal VGL outputs a constant low level.

Figure 5:
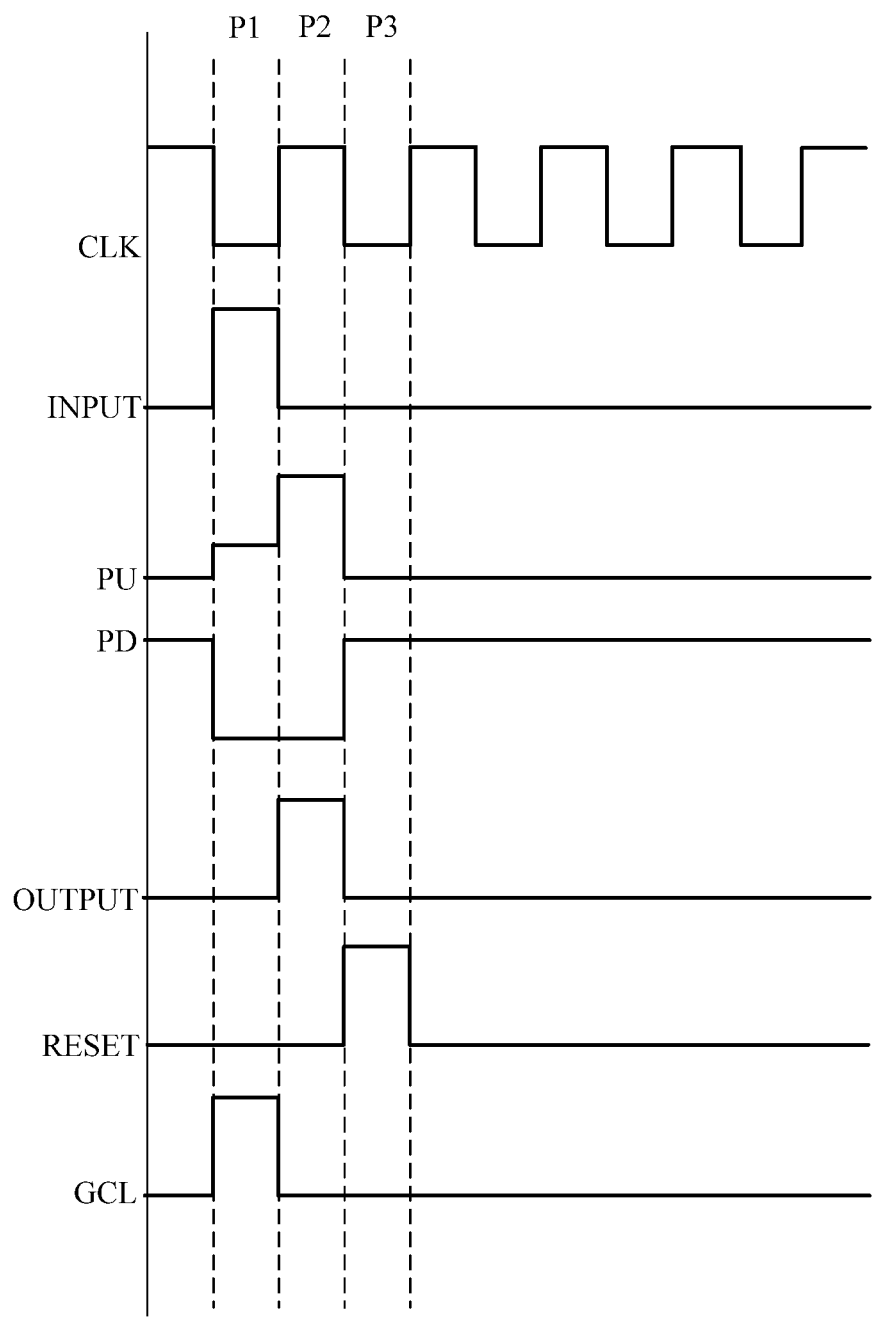
FIG. 5 is a timing diagram of each control signal for driving the shift register unit shown in FIG. 4.

Specifically, one image frame includes a first period P1, a second period P2, and a third period P3, as shown in FIG. 5.

In the embodiment, in the first period P1 of the one image frame: CLK=0, INPUT=1, PU=1, PD=0, OUTPUT=0, RESET=0, GCL=1; where "1" represents a high level, and "0" represents a low level.

In this case, under the control of the signal input terminal INPUT, the fourth transistor M4 is turned on and outputs a high level of the first voltage terminal VDD to the pull-up node PU. At this time, under the control of the pull-up node PU, the third transistor M3 is turned on and outputs a low level of the clock signal CLK to the signal output terminal OUTPUT.

Further, under the control of the pull-up node PU, the second transistor M2 is turned on, and pulls the voltage level of the pull-down node PD down to the low level of the second voltage terminal VGL.

On the basis of this, the fourth voltage terminal GCL inputs a high level and the eighth transistor M8 is turned on, thereby lowering the voltage level of the signal output terminal OUTPUT to the low level of the second voltage terminal VGL, to clear the voltage remaining on the signal output terminal OUTPUT. All the other transistors are in the off state.

As can be seen from above, the signal output terminal OUTPUT outputs a low level in the first period P1, so that the first period P1 is a non-output period of the shift register unit.

In the second period P2 of one image frame: CLK=1, INPUT=0, PU=1, PD=0, OUTPUT=1, RESET=0, GCL=0.

In this case, the voltage level of the pull-up node PU is further drawn higher under the bootstrap action of the second capacitor C2. At this time, under the control of the pull-up node PU, the third transistor M3 is in an on state and the high level of the clock signal CLK is output as the gate drive signal to the signal output terminal OUTPUT, to scan the gate line connected to the signal output terminal OUTPUT.

Further, under the control of the pull-up node PU, the second transistor M2 is turned on and pulls the voltage level of the pull-down node PD down to the low level of the second voltage terminal VGL. All the remaining transistors are in the off state.

It may be seen above, the signal output terminal OUTPUT outputs the gate scan signal in the second period P2, so that the second period P2 is the output period of the shift register unit.

In the third period P3 of one image frame: CLK=0, INPUT=0, PU=0, PD=1, OUTPUT=0, RESET=1, GCL=0.

In this case, under the control of the reset signal terminal RESET, the fifth transistor M5 is turned on and thereby lowers the voltage level of the pull-up node PU to the low level of the second voltage terminal VGL. At this time, under the control of the pull-up node PU, the first transistor M1 is turned on and the high level of the third voltage terminal M3 is stored in the first capacitor C1. In addition, the high level of the third voltage terminal M3 is output to the pull-down node PD through the first transistor M1.

The sixth transistor M6 and the seventh transistor M7 are turned on under the control of the pull-down node PD. The voltage level of the pull-up node PU is pulled down to the low level of the second voltage terminal VGL through the sixth transistor M6, and the voltage level of the signal output terminal OUTPUT is pulled down to the low level of the second voltage terminal VGL by the seventh transistor M7. The remaining transistors are in the off state.

In addition, the pull-up node PU is pulled down to the low level of the second voltage terminal VGL through the sixth transistor M6 until the next image frame. Thus, the third voltage terminal VGH may charge the first capacitor C1 all the time through the first transistor M1, and the first capacitor C1 may output the stored high level to the pull-down node PD all the time, such that the pull-down node PD is remained at a high level.

As can be seen from above, during the third period P3 and a period before the next image frame and after the third period P3, the signal output terminal OUTPUT outputs a low level. Thus, the third period P3 and the period before the next image frame and after the third period P3 are the non-output period of the shift register.

Within this period, during the process when the third voltage terminal VGH charges the first capacitor C1 through the first transistor M1, when voltages of the first electrode and the second electrode of the first transistor M1 are equal to each other, although the first transistor M1 is turned on, it is not in an operating state. The first transistor M1 is in an operating state only during a period in which the first capacitor C1 is charged from 0V to a voltage of the third voltage terminal VGH in one image frame. Since the charging time of the first capacitor C1 is quite short, the time period during which the first transistor M1 is in the operating state in one image frame is also short, which avoids the problem that the first transistor M1 is in a bias state for a long time, thus improving the lifespan of the first transistor M1.

In addition, the above shift register may provide the gate drive signal to the signal output terminal OUTPUT only through the eight transistors and two capacitors, thus, the shift register employs relatively fewer transistors and capacitors, has a simple structure, occupies small wiring space, which is conducive to the design trend of narrow frames.

It should be noted that, the specific driving process of the shift register unit is described with reference to the case where the first transistor M1 is a P-type transistor and the remaining transistors are N-type transistors as an example, and when the first transistor M1 is an N-type transistor, the remaining transistors are P-type transistors, a part of the control signal waveforms in FIG. 5 needs to be reversed, and the operating principle of the shift register is the same as that described above, which will not be repeated herein.

Figure 6:
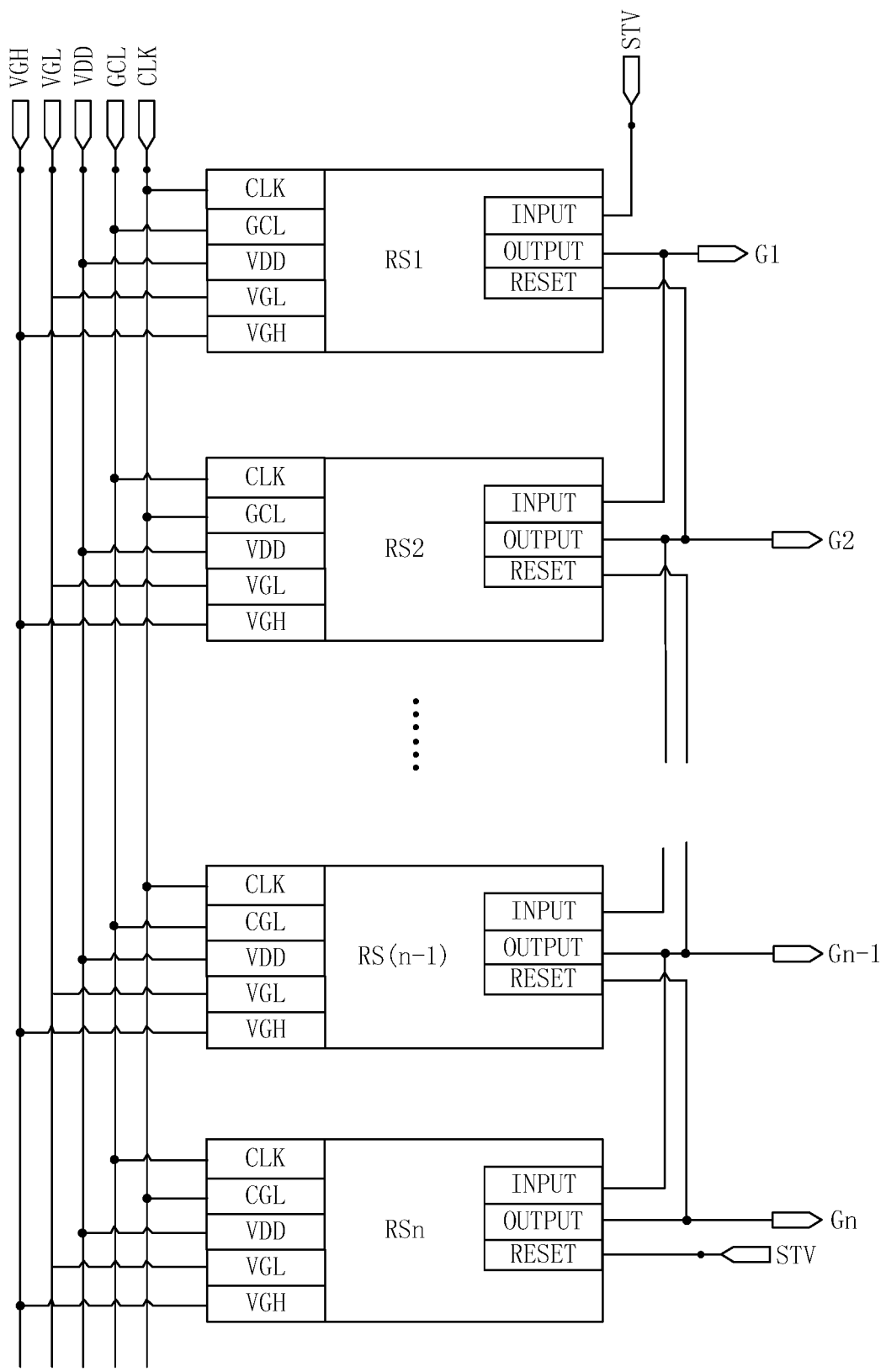
FIG. 6 is a schematic structural view of a gate driving circuit composed of a plurality of stages of the shift register unit as shown in FIG. 1 or 2.

The embodiments of the present disclosure provide a gate driving circuit, for inputting the gate driving signal line by line to the gate lines (G1, G2 ... G (n−1), Gn) shown in FIG. 6. The gate driving circuit includes a plurality of any one of the above register units (RS1, RS2 . . . RSn) that are cascaded.

Specifically, a signal input terminal INPUT of a first stage shift register unit RS1 is connected to the start signal terminal STV.

Except for the first stage shift register unit RS1, a signal output terminal OUTPUT of a previous stage shift register unit is connected to a signal input terminal INPUT of a next stage shift register unit.

Except for a last stage shift register unit RSn, a signal output terminal OUTPUT of the next stage shift register unit is connected to a reset signal terminal RESET of the previous stage shift register unit.

A reset signal terminal RESET of the last stage shift register unit RSn is connected to the above start signal terminal STV. When the signal of the start signal terminal STV is input to the signal input terminal INPUT of the first stage shift register unit RS1, the reset signal terminal RESET of the last stage shift register unit RSn may use the signal of the start signal terminal STV as a reset signal to reset the last stage shift register unit RSn. Optionally, the reset signal terminal RESET of the last stage shift register unit RSn may be connected to a signal terminal separately.

The embodiments of the present disclosure provide a display device, including the gate driving circuit as described above. The same structure and advantageous effects as the gate driving circuit provided in the foregoing embodiments may be achieved and will not be repeated since the structure and the advantageous effects of the gate driving circuit have been described in detail in the foregoing embodiments.

It should be noted that, in the embodiments of the present disclosure, the display device may specifically include at least a liquid crystal display device and an organic light emitting diode display device. For example, the display device may be a liquid crystal display, a liquid crystal television, a digital photo frame, a mobile phone or a tablet computer and any product or part that has a display function.

The embodiments of the present disclosure provide a driving method for driving any one of the shift register unit described above, wherein, within one image frame, the driving method includes following steps.

In a first period P1 shown in FIG. 5, the pull-up control module 10 outputs the voltage of the first voltage terminal VDD to the pull-up node PU under the control of the signal input terminal INPUT to charge the pull-up node PU.

Specifically, when the structure of the pull-up control module 10 includes the fourth transistor M4 as shown in FIG. 3 or FIG. 4 and the fourth transistor M4 is an N-type transistor, the fourth transistor M4 is turned on and outputs a high level of the first voltage terminal VDD to the pull-up node PU. At this time, under the control of the pull-up node PU, the third transistor M3 is turned on and outputs a low level of the clock signal CLK to the signal output terminal.

In addition, when the shift register unit further includes a reconfiguring module 60 as shown in FIG. 2, in the above first period P1, the method further includes: the reconfiguring module 60 pulling the voltage level of the signal output terminal OUTPUT down to the second voltage terminal VGL under control of a fourth voltage terminal GCL. When a structure of the reconfiguring module 60 is as shown in FIG. 4 and includes an eighth transistor M8, during the first period P1, the eighth transistor M8 is turned on, thereby lowering the voltage level of the signal output terminal OUTPUT to the low level of the second voltage terminal VGL, to clear the voltage remaining on the signal output terminal OUTPUT. All the other transistors are in the off state.

Next, in a second period, the pull-up module 30 outputs the signal of the clock signal terminal CLK as a gate scan signal to the signal output terminal OUTPUT under the control of the pull-up node PU.

Specifically, when the pull-up control module 30 includes the third transistor M3 and the second capacitor M2 as shown in FIG. 3 or FIG. 4, the voltage level of the pull-up node PU is further drawn higher under the bootstrap action of the second capacitor C2. At this time, under the control of the pull-up node PU, the third transistor M3 is in an on state and the high level of the clock signal CLK is output as the gate drive signal to the signal output terminal OUTPUT, to scan the gate line connected to the signal output terminal OUTPUT.

In addition, when a structure of the pull-down control module is as shown in FIG. 3 or FIG. 4, under the control of the pull-up node PU, the second transistor M2 is turned on and pulls the voltage level of the pull-down node PD down to the low level of the second voltage terminal VGL.

Next, in a third period, the reset module 20 pulls the voltage level of the pull-up node PU down to the second voltage terminal VGL under the control of the reset signal terminal RESET.

The pull-down control module 40 is configured to store a voltage of the third voltage terminal VGH and output a voltage of the third voltage terminal VGH to the pull-down node PD or release the stored voltage to the pull-down node PD under control of the third voltage terminal VGH and the second voltage terminal VGL.

In addition, the pull-down module 50 is configured to pull the voltage level of the pull-up node PU and a voltage level of the signal output terminal OUTPUT down to the second voltage terminal VGL under control of the pull-down node PD.

Based on this, when the above pull-down control module 40 includes the first transistor M1, the first capacitor C1 and the second transistor M2 as shown in FIG. 3 or FIG. 4, and the first transistor M1 is a P-type transistor, the second transistor M2 is an N-type transistor, the driving method of the pull-down control module 40 in the third period P3 includes following steps.

The second transistor M2 is turned off and the first transistor M1 is turned on under the control of the pull-up node PU. At this time, the third voltage terminal VGH charges the pull-down node PD through the first transistor M1. In addition, the voltage of the third voltage terminal VGH is stored into the first capacitor C1, and the first capacitor C1 outputs the stored voltage to the pull-down node PD when the voltage of the first electrode of the first transistor M1 is equal to that of the second electrode of the first transistor M1.

On the basis of this, when the pull-down module 50 includes the sixth transistor M6 and the seventh transistor M7 as shown in FIG. 3 or FIG. 4, the sixth transistor M6 and the seventh transistor M7 are turned on under the control of the pull-down node PD. The voltage level of the pull-up node PU is pulled down to the low level of the second voltage terminal VGL through the sixth transistor M6, and the voltage level of the signal output terminal OUTPUT is pulled down to the low level of the second voltage terminal VGL by the seventh transistor M7.

Next, The pull-down control module 40 repeats the above third period until a next image frame. Specially, the pull-up node PU is pulled down to the low level of the second voltage terminal VGL all the time through the sixth transistor M6. Thus, the third voltage terminal VGH may charge the first capacitor C1 all the time through the first transistor M1, and the first capacitor C1 may output the stored high level to the pull-down node PD all the time, such that the pull-down node PD is remained at a high level.

During the above stage, since the first transistor M1 is in an operating state only during a period in which the first capacitor C1 is charged from 0V to a voltage of the third voltage terminal VGH in one image frame, it avoids the problem that the first transistor M1 is in a bias state for a long time, thus improving the lifespan of the first transistor M1.

The embodiments of the present disclosure provide a shift register unit, a driving method thereof, a gate driving circuit and a display device. The shift register unit includes a pull-up control module, a reset module, a pull-up module, a pull-down control module and a pull-down module. In the embodiment, the pull-up control module is connected to a first voltage terminal, a signal input terminal and a pull-up node. The pull-up control module is configured to output a voltage of the first voltage terminal to the pull-up node under control of the signal input terminal. The reset module is connected to a reset signal terminal, a second voltage terminal, and the pull-up node. The reset module is configured to pull a voltage level of the pull-up node down to the second voltage terminal under control of the reset signal. The pull-up module is connected to the pull-up node, a clock signal terminal and a signal output terminal. The pull-up module is configured to output a signal of the clock signal terminal to the signal output terminal under control of the pull-up node. The pull-down control module is connected to the second voltage terminal, a third voltage terminal, the pull-up node and a pull-down node. The pull-down control module is configured to pull a voltage level of the pull-down node down to the second voltage terminal under control of the pull-up node, or the pull-down control module is configured to store a voltage of the third voltage terminal and output a voltage of the third voltage terminal to the pull-down node or release the stored voltage to the pull-down node under control of the third voltage terminal and the second voltage terminal. The pull-down module is connected to the pull-down node, the pull-up node, the signal output terminal and the second voltage terminal. The pull-down module is configured to pull the voltage level of the pull-up node and a voltage level of the signal output terminal down to the second voltage terminal under control of the pull-down node.

In this way, in the output period of the shift register unit, the pull-up module may output the signal of the clock signal as a gate scan signal to a gate line connected to the signal output terminal under the control of the pull-up node. While in the non-output period of the shift register unit, a voltage level of the signal output terminal needs to be pulled down to a voltage of the second voltage terminal through the pull-down module under the control of the pull-down node. In order to make the pull-down node have the above function, in the non-output period, the pull-down control module may output the voltage of the third voltage terminal to the pull-down node or the pull-down control module may release the stored voltage to the pull-down node, to ensure a voltage level of the pull-down node. Thus, the transistor in the pull-down control module for outputting the voltage of the third voltage terminal to the pull-down node does not need to remain in an operating state the whole time during the non-output period, so that the service life of the above transistor may be prolonged.

As described above, only the specific embodiments of the present disclosure are illustrated, but the protection scope of the present disclosure is not limited thereto. Changes or substitutions that are readily contemplated by those skilled in the art within the technical scope in the present disclosure should be within the protection scope of the present disclosure. Thus, the protection scope of the present disclosure should be based on the protection scope of the claims.

What is claimed is:

1. A shift register unit, comprising a pull-up control module, a reset module, a pull-up module, a pull-down control module and a pull-down module, wherein:
   the pull-up control module is connected to a first voltage terminal, a signal input terminal and a pull-up node, and the pull-up control module is configured to output a voltage of the first voltage terminal to the pull-up node under control of the signal input terminal;
   the reset module is connected to a reset signal terminal, a second voltage terminal, and the pull-up node, and the reset module is configured to pull a voltage level of the pull-up node down to a voltage of the second voltage terminal under control of the reset signal;
   the pull-up module is connected to the pull-up node, a clock signal terminal and a signal output terminal, and the pull-up module is configured to output a signal of the clock signal terminal to the signal output terminal under control of the pull-up node;
   the pull-down control module is connected to the second voltage terminal, a third voltage terminal, the pull-up node and a pull-down node, and the pull-down control module is configured to pull a voltage level of the pull-down node down to the voltage of the second voltage terminal under control of the pull-up node, or the pull-down control module is configured to store a voltage of the third voltage terminal and output the voltage of the third voltage terminal to the pull-down node or release the stored voltage to the pull-down node under control of the third voltage terminal and the second voltage terminal;
   the pull-down module is connected to the pull-down node, the pull-up node, the signal output terminal and the second voltage terminal, and the pull-down module is configured to pull the voltage level of the pull-up node and a voltage level of the signal output terminal down to the voltage of the second voltage terminal under control of the pull-down node;
   wherein the pull-down control module comprises a first transistor, a second transistor and a first capacitor;
   a gate electrode of the first transistor is connected to the pull-up node, a first electrode of the first transistor is connected to the third voltage terminal, and a second electrode of the first transistor is connected to a first end of the first capacitor;
   a second end of the first capacitor is connected to the second voltage terminal; and
   a gate electrode of the second transistor is connected to the pull-up node, a first electrode of the second transistor is connected to the pull-down node, and a second electrode of the second transistor is connected to the second voltage terminal; and
   wherein the first transistor is a P-type transistor and the second transistor is an N-type transistor; or the first transistor is an N-type transistor and the second transistor is a P-type transistor.

2. The shift register unit according to claim 1, further comprising a reconfiguring module connected to a fourth voltage terminal, the second voltage terminal and the signal output terminal, and the reconfiguring module is configured to pull the voltage level of the signal output terminal down to the voltage of the second voltage terminal under control of the fourth voltage terminal.

3. The shift register unit according to claim 2, wherein the reconfiguring module comprises an eighth transistor, a gate electrode of the eighth transistor is connected to the fourth voltage terminal, a first electrode of the eighth transistor is connected to the signal output terminal and a second electrode of the eighth transistor is connected to the second voltage terminal.

4. The shift register unit according to claim 1, wherein the pull-up module comprises a third transistor and a second capacitor;
   a gate electrode of the third transistor is connected to the pull-up node, a first electrode of the third transistor is connected to the clock signal terminal and a second electrode of the third transistor is connected to the signal output terminal; and
   a first end of the second capacitor is connected to the gate electrode of the third transistor and a second end of the second capacitor is connected to a second electrode of the third transistor.

5. The shift register unit according to claim 1, wherein the pull-up control module comprises a fourth transistor, a gate electrode of the fourth transistor is connected to the signal input terminal, a first electrode of the fourth transistor is connected to the first voltage terminal and a second electrode of the fourth transistor is connected to the pull-up node.

6. The shift register unit according to claim 1, wherein the reset module comprises a fifth transistor, a gate electrode of the fifth transistor is connected to the reset signal terminal, a first electrode of the fifth transistor is connected to the pull-up node and a second electrode of the fifth transistor is connected to the second voltage terminal.

7. The shift register unit according to claim 1, wherein the pull-down module comprises a sixth transistor and a seventh transistor;
   a gate electrode of the sixth transistor is connected to the pull-down node, a first electrode of the sixth transistor is connected to the pull-up node and a second electrode of the sixth transistor is connected to the second voltage terminal; and
   a gate electrode of the seventh transistor is connected to the pull-down node, a first electrode of the seventh transistor is connected to the signal output terminal, and a second electrode of the seventh transistor is connected to the second voltage terminal.

8. A gate driving circuit, comprising a plurality of cascaded shift register units according to claim 1, wherein
   a signal input terminal of a first stage shift register unit is connected to a start signal terminal;
   except for the first stage shift register unit, a signal output terminal of a previous stage shift register unit is connected to a signal input terminal of a next stage shift register unit;
   except for a last stage shift register unit, a signal output terminal of the next stage shift register unit is connected to a reset signal terminal of the previous stage shift register unit; and a reset signal terminal of the last stage shift register unit is connected to the start signal terminal.

9. The gate driving circuit according to claim 8, further comprising a reconfiguring module connected to a fourth voltage terminal, the second voltage terminal and the signal output terminal, and the reconfiguring module is configured to pull the voltage level of the signal output terminal down to the voltage of the second voltage terminal under control of the fourth voltage terminal.

10. The gate driving circuit according to claim 9, wherein the reconfiguring module comprises an eighth transistor, a gate electrode of the eighth transistor is connected to the fourth voltage terminal, a first electrode of the eighth transistor is connected to the signal output terminal and a second electrode of the eighth transistor is connected to the second voltage terminal.

11. The gate driving circuit of claim 8, wherein the pull-up module comprises a third transistor and a second capacitor;
a gate electrode of the third transistor is connected to the pull-up node, a first electrode of the third transistor is connected to the clock signal terminal and a second electrode of the third transistor is connected to the signal output terminal; and
a first end of the second capacitor is connected to the gate electrode of the third transistor and a second end of the second capacitor is connected to a second electrode of the third transistor.

12. The gate driving circuit according to claim 8, wherein the pull-up control module comprises a fourth transistor, a gate electrode of the fourth transistor is connected to the signal input terminal, a first electrode of the fourth transistor is connected to the first voltage terminal and a second electrode of the fourth transistor is connected to the pull-up node.

13. The gate driving circuit of claim 8, wherein the reset module comprises a fifth transistor, a gate electrode of the fifth transistor is connected to the reset signal terminal, a first electrode of the fifth transistor is connected to the pull-up node and a second electrode of the fifth transistor is connected to the second voltage terminal.

14. The gate driving circuit according to claim 8, wherein the pull-down module comprises a sixth transistor and a seventh transistor;
a gate electrode of the sixth transistor is connected to the pull-down node, a first electrode of the sixth transistor is connected to the pull-up node and a second electrode of the sixth transistor is connected to the second voltage terminal; and
a gate electrode of the seventh transistor is connected to the pull-down node, a first electrode of the seventh transistor is connected to the signal output terminal, and a second electrode of the seventh transistor is connected to the second voltage terminal.

15. A display device, comprising the gate driving circuit according to claim 8.

16. A driving method for driving a shift register unit comprising a pull-up control module, a reset module, a pull-up module, a pull-down control module and a pull-down module, wherein:
the pull-up control module is connected to a first voltage terminal, a signal input terminal and a pull-up node, and the pull-up control module is configured to output a voltage of the first voltage terminal to the pull-up node under control of the signal input terminal;
the reset module is connected to a reset signal terminal, a second voltage terminal, and the pull-up node, and the reset module is configured to pull a voltage level of the pull-up node down to a voltage of the second voltage terminal under control of the reset signal;
the pull-up module is connected to the pull-up node, a clock signal terminal and a signal output terminal, and the pull-up module is configured to output a signal of the clock signal terminal to the signal output terminal under control of the pull-up node;
the pull-down control module is connected to the second voltage terminal, a third voltage terminal, the pull-up node and a pull-down node, and the pull-down control module is configured to pull a voltage level of the pull-down node down to the voltage of the second voltage terminal under control of the pull-up node, or the pull-down control module is configured to store a voltage of the third voltage terminal and output the voltage of the third voltage terminal to the pull-down node or release the stored voltage to the pull-down node under control of the third voltage terminal and the second voltage terminal; and
the pull-down module is connected to the pull-down node, the pull-up node, the signal output terminal and the second voltage terminal, and the pull-down module is configured to pull the voltage level of the pull-up node and a voltage level of the signal output terminal down to the voltage of the second voltage terminal under control of the pull-down node, wherein the pull-down control module of the shift register unit comprises a first transistor, a first capacitor, and a second transistor, and the first transistor is a P-type Transistor, the second transistor is an N-direction transistor;
within one image frame, the driving method comprises:
in a first period, the pull-up control module outputting the voltage of the first voltage terminal to the pull-up node under the control of the signal input terminal to charge the pull-up node;
in a second period, the pull-up module outputting the signal of the clock signal terminal as a gate scan signal to the signal output terminal under the control of the pull-up node;
in a third period, the reset module pulling the voltage level of the pull-up node down to the voltage of the second voltage terminal under the control of the reset signal terminal;
the pull-down control module storing the voltage of the third voltage terminal and outputting the voltage of the third voltage terminal to the pull-down node or releasing the stored voltage to the pull-down node under the control of the third voltage terminal and the second voltage terminal;
the pull-down module pulling the voltage level of the pull-up node and the voltage level of the signal output terminal down to the voltage of the second voltage terminal under the control of the pull-down node; and
the pull-down control module repeating the third period until a next image frame; and
driving of the pull-down control module in the third stage comprises:
the second transistor being turned off and the first transistor being turned on under the control of the pull-up node; and the third voltage terminal charging the pull-down node through the first transistor; and
storing the voltage of the third voltage terminal into the first capacitor, and the first capacitor outputting the stored voltage to the pull-down node when the voltage of the first electrode of the first transistor is equal to that of the second electrode of the first transistor.

17. The driving method for driving the shift register unit according to claim 16, wherein when the shift register unit comprises a reconfiguring module, in the first stage, the method further comprises:
the reconfiguring module pulling the voltage level of the signal output terminal down to the voltage of the second voltage terminal under control of a fourth voltage terminal.

* * * * *